(12) United States Patent  
Chang et al.

(10) Patent No.: US 10,537,041 B2
(45) Date of Patent: Jan. 14, 2020

(54) HEAT DISSIPATION SYSTEM WITH AIR SENSATION FUNCTION

(71) Applicant: ASIA VITAL COMPONENTS CO., LTD., New Taipei (TW)

(72) Inventors: Bor-Haw Chang, New Taipei (TW); Wen-Hao Liu, New Taipei (TW)

(73) Assignee: Asia Vital Components Co., Ltd., New Taipei, Taiwan (CN)

( * ) Notice: Subject to any disclaimer, the term of this patent is extended or adjusted under 35 U.S.C. 154(b) by 0 days.

(21) Appl. No.: 15/242,607

(22) Filed: Aug. 22, 2016

(65) Prior Publication Data

US 2018/0054917 A1 Feb. 22, 2018

(51) Int. Cl.
*H05K 7/20* (2006.01)

(52) U.S. Cl.
CPC ..... *H05K 7/20209* (2013.01); *H05K 7/20154* (2013.01); *H05K 7/20172* (2013.01)

(58) Field of Classification Search
CPC ............... F24F 11/0079; F04D 27/004; H05K 7/20172; H05K 7/20209; H05K 7/20736; G06F 1/206
USPC .......................................... 165/246; 361/695
See application file for complete search history.

(56) References Cited

U.S. PATENT DOCUMENTS

| | | | | |
|---|---|---|---|---|
| 5,269,660 A * | 12/1993 | Pradelle | ..................... | E21F 1/00 417/18 |
| 2003/0227757 A1 * | 12/2003 | Vincent | .............. | H05K 7/20172 361/796 |
| 2004/0112582 A1 * | 6/2004 | Beitelmal | ............... | G06F 1/206 165/247 |
| 2004/0251344 A1 * | 12/2004 | Lutton | .................... | G01F 1/363 241/47 |
| 2007/0022770 A1 * | 2/2007 | Liu | ....................... | F25B 49/022 62/228.1 |
| 2007/0032187 A1 * | 2/2007 | Liu | ....................... | F24F 11/0001 454/186 |
| 2009/0099792 A1 * | 4/2009 | Riegler | ................... | G06F 1/206 702/45 |
| 2009/0277622 A1 * | 11/2009 | Nair | .................... | F24F 11/0001 165/246 |

(Continued)

FOREIGN PATENT DOCUMENTS

| CN | 202511387 | * | 10/2012 |
|---|---|---|---|
| DE | 3343284 | * | 6/1985 |
| JP | 20026992 | * | 1/2002 |

(Continued)

*Primary Examiner* — Eric S Ruppert
(74) *Attorney, Agent, or Firm* — Thomas J. Nikolai; DeWitt LLP

(57) ABSTRACT

A heat dissipation system with air sensation function includes a chassis, multiple fans, multiple air sensation units and an external control device connected to the fans. The chassis has an installation face for installing the fans thereon. The air sensation units are respectively disposed on the fans for detecting the air state of the corresponding fans to generate an air sensation signal. The external control device serves to receive the air sensation signal transmitted from the air sensation units and compare the data contained in the air sensation signal with preset data so as to control/adjust the rotational speed of the corresponding fans. Accordingly, a uniform airflow flows out of the fans to effectively lower the noise.

5 Claims, 12 Drawing Sheets

(56) References Cited

U.S. PATENT DOCUMENTS

2011/0122572 A1* 5/2011 Cheng ................ H05K 7/20736
  361/679.48
2011/0250051 A1* 10/2011 Smiley, III ............ F04D 27/001
  415/26

FOREIGN PATENT DOCUMENTS

| TW | M394500 U1 | 12/2010 |
| TW | 1360739 BI | 3/2012 |
| TW | 201504794 A | 2/2015 |
| TW | 1495990 B | 8/2015 |
| TW | 201625124 A | 7/2016 |

* cited by examiner

HEAT DISSIPATION SYSTEM WITH AIR SENSATION FUNCTION

BACKGROUND OF THE INVENTION

1. Field of the Invention

The present invention relates generally to a heat dissipation system, and more particularly to a heat dissipation system with air sensation function. The heat dissipation system is able to control multiple fans to blow out uniform airflow.

2. Description of the Related Art

Along with the development and advance of network science and technology, the demanded quantity of the servers on the market has become greater and greater. The most important characteristic of the server mainframe is that the server mainframe has very powerful operation ability. The more powerful the operation ability of the server mainframe is, the higher the heat generated by the server mainframe in operation is. After a long term of operation, the operation performance of the server will be affected. In some more serious cases, the server may damage due to overheating. To solve the above problem, the server is often arranged in a well ventilated chassis.

Please refer to FIG. 7, which shows a conventional chassis structure for containing therein various electronic devices. The chassis 51 has an internal receiving space for receiving various electronic devices (such as servers or other information equipment). Multiple fans 52 are installed on one face of the chassis 51. The fans 52 serve to drive the air to flow and create airflow for carrying the heat generated by the electronic devices out of the chassis 51 so as to lower the temperature of the electronic devices. In addition, in order to enhance the heat dissipation effect of the chassis 51, the multiple fans 52 are generally arranged on the chassis 51 in parallel so as to enhance the air volume for dissipating the heat. However, the fans 52 are installed on the installation face of the chassis 51 in different positions so that the air volumes (or the exhausted air volumes) of the fans 52 are different from each other. As a result, the airflow speeds of the fans are different from each other. The difference between the airflow speeds will lead to air pressure change. Therefore, different extents of eddies 6 will be produced at the air outlets of the fans 52 due to the difference between the flow fields as a whole. The eddy is exactly the cause of noise.

SUMMARY OF THE INVENTION

It is therefore a primary object of the present invention to provide a heat dissipation system with air sensation function. The heat dissipation system is able to effectively lower the noise.

It is a further object of the present invention to provide a heat dissipation system with air sensation function. The heat dissipation system includes an external control device. The external control device is able to control/adjust the rotational speed of every fan installed on a chassis so as to change the airflow speed of the fan. Accordingly, the airflows flowing out of the fans are unified.

It is still a further object of the present invention to provide a heat dissipation system with air sensation function. The heat dissipation system includes multiple fans installed on a chassis. The fans can control/adjust their own rotational speed so as to change the airflow speed. Accordingly, the airflows flowing out of the fans are unified.

To achieve the above and other objects, the heat dissipation system with air sensation function of the present invention includes a chassis, multiple air sensation units, multiple fans and an external control device. The chassis has at least one installation face and a receiving space. The fans are correspondingly disposed on the installation face in communication with the receiving space. The air sensation units are respectively correspondingly disposed on the fans for detecting the air state (such as wind pressure or wind speed of the air) of the fans to generate an air sensation signal. The external control device is connected to the corresponding fans and the air sensation units. The external control device serves to receive the air sensation signal transmitted from the air sensation units and compare the data contained in the air sensation signal with preset data to find whether the data contained in the air sensation signal are identical to the preset data. In case it is found that the data contained in the air sensation signal of at least one fan are not identical to the preset data, the external control device controls/adjusts the rotational speed of the at least one fan. Accordingly, by means of the heat dissipation system of the present invention, the airflows flowing out of the fans are unified so that the noise is effectively lowered.

Still to achieve the above and other objects, the heat dissipation system with air sensation function of the present invention includes a chassis, multiple fans and multiple air sensation units. The chassis has at least one installation face and a receiving space. The fans are correspondingly disposed on the installation face in communication with the receiving space. A processing unit is disposed in each fan for controlling/driving the fan to operate. The air sensation units are respectively correspondingly disposed on the fans for detecting the air state (such as wind pressure or wind speed of the air) of the fans to generate an air sensation signal. Each air sensation unit is connected to the processing unit of each corresponding fan. The processing unit of each fan serves to receive the air sensation signal transmitted from the air sensation unit of the same fan and compare the data contained in the air sensation signal with preset data to find whether the data contained in the air sensation signal are identical to the preset data. In case it is found that the data contained in the air sensation signal are not identical to the preset data, the processing unit of each fan controls/adjusts the rotational speed of the fan itself. Accordingly, by means of the heat dissipation system of the present invention, the airflows flowing out of the fans are unified so that the noise is effectively lowered.

In the above heat dissipation system, each fan has a frame body and an impeller. The frame body has an air inlet side, an air outlet side and a flow way positioned between the air inlet side and the air outlet side. The air inlet side communicates with the air outlet side, the flow way and the receiving space. The impeller is received in the flow way of the frame body.

In the above heat dissipation system, the air sensation unit is positioned on an inner side of the frame body at the air outlet side or the air inlet side.

In the above heat dissipation system, the air sensation unit is positioned on an inner side of the frame body in the flow way.

In the above heat dissipation system, the external control device is received in the receiving space of the chassis corresponding to the fans. The external control device is a server, a notebook, an intelligent mobile device or a computer.

In the above heat dissipation system, the processing unit is a central processing unit or a microprocessor control unit.

In the above heat dissipation system, the air sensation unit is a wind speed sensor for detecting the wind speed of the air blown out from the corresponding fan to generate the air sensation signal. The data contained in the air sensation signal include wind speed data. The preset data include preset wind speed data.

In the above heat dissipation system, the air sensation unit is a pressure sensor for detecting the wind pressure of the air blown out from the corresponding fan to generate the air sensation signal. The data contained in the air sensation signal include wind pressure data. The preset data include preset wind pressure data.

In the above heat dissipation system, each air sensation unit includes a microcontroller unit, a pressure sensor and a temperature sensor. The pressure sensor serves to detect the wind pressure of the air blown out of the corresponding fan to generate a wind pressure sensation signal. The temperature sensor serves to detect the ambient temperature of the corresponding fan to generate a temperature sensation signal. According to a temperature value of the temperature sensation signal and correction data, the microcontroller unit performs an operation to obtain an ambient temperature value. On the basis of the ambient temperature value and the wind pressure value of the wind pressure sensation signal, the microcontroller unit further performs an operation to generate the air sensation signal. The data contained in the air sensation signal include corrected wind pressure data. The preset data include preset wind pressure data.

In the above heat dissipation system, in case it is found by the external control device that the data contained in the air sensation signal of the fans are identical to the preset data, the external control device will not control/adjust the rotational speed of the fans.

In the above heat dissipation system, the installation face has multiple installation holes passing through the installation face in communication with the receiving space. The fans are correspondingly installed in the installation holes.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
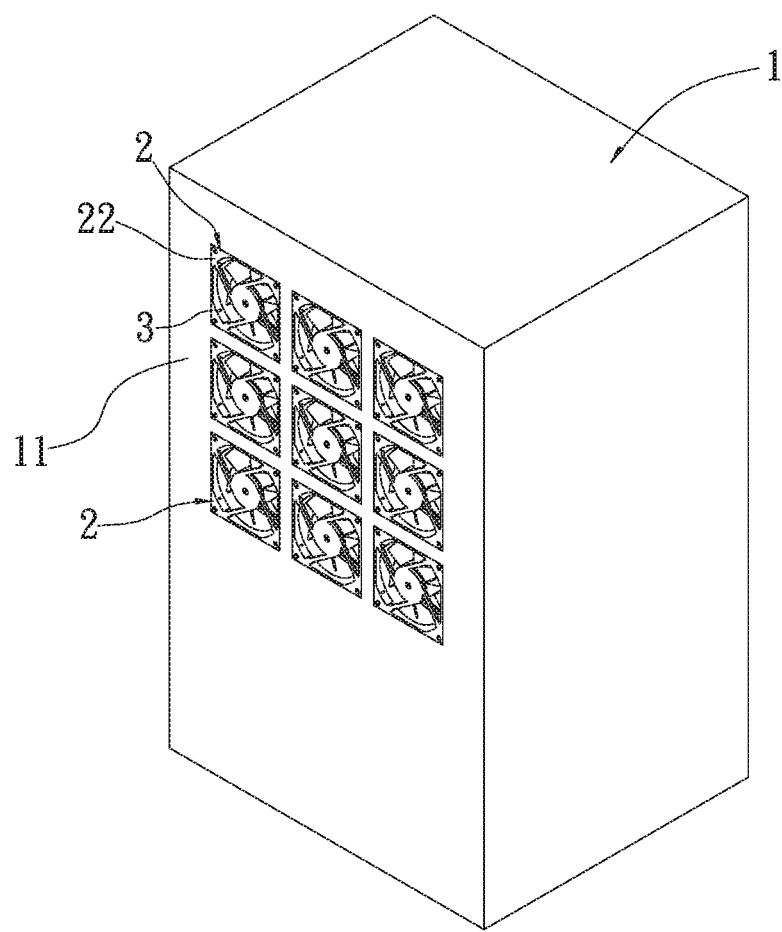
FIG. 1 is a perspective assembled view of the heat dissipation system of the present invention.
Figure 1A:
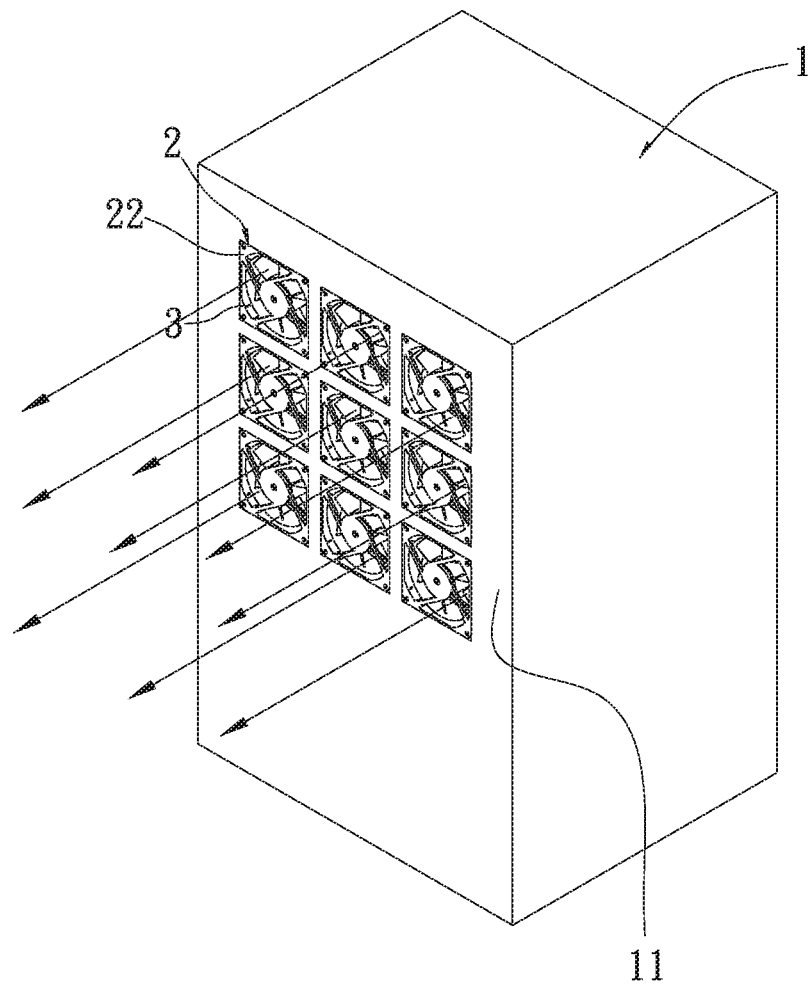
FIG. 1A is a perspective view of the heat dissipation system of the present invention, showing the operation thereof.
Figure 2:
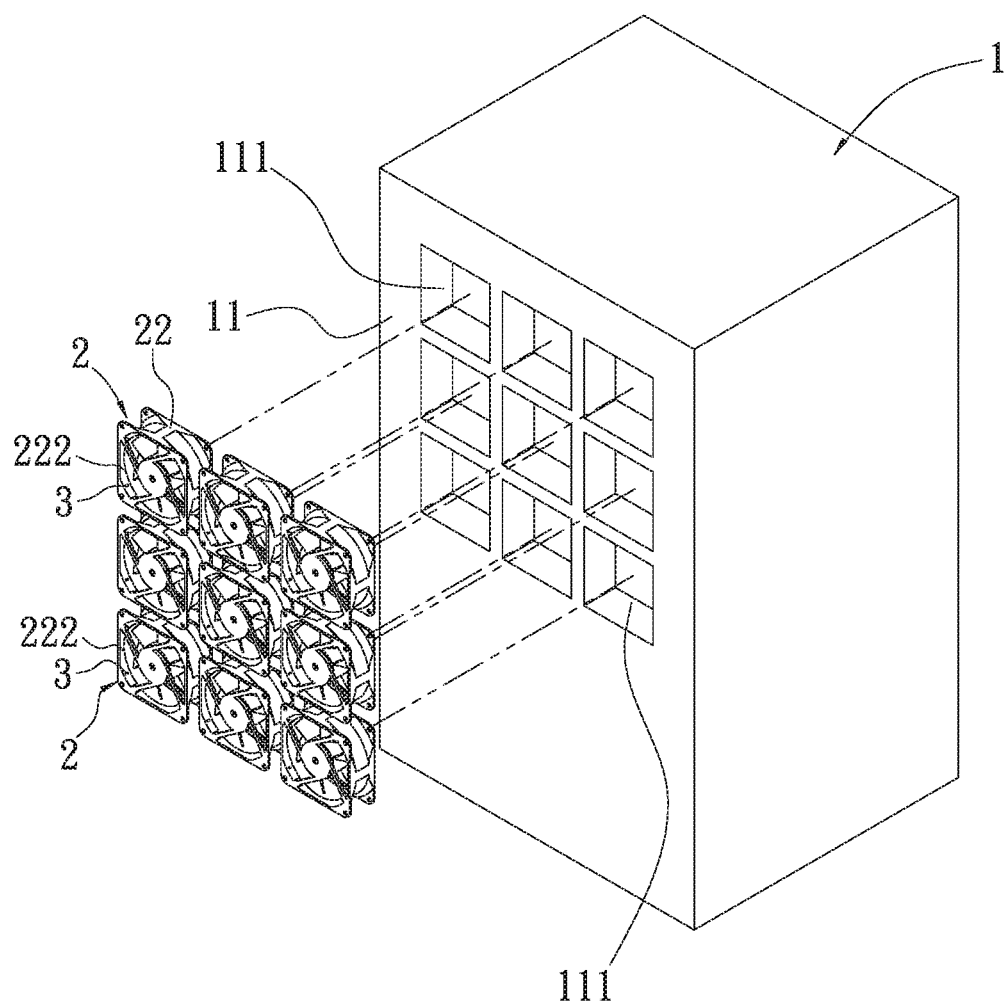
FIG. 2 is a perspective exploded view of the heat dissipation system of the present invention.
Figure 3:
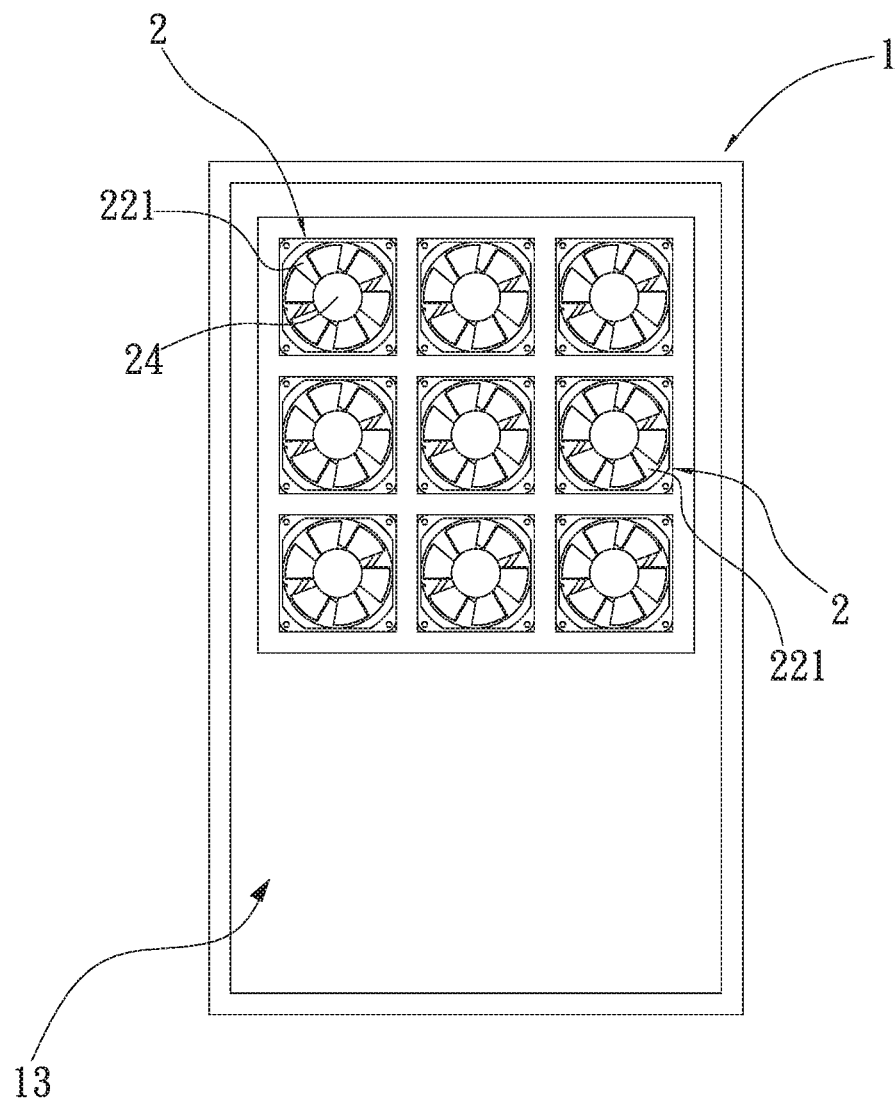
FIG. 3 is a front view of the heat dissipation system of the present invention.
Figure 4:
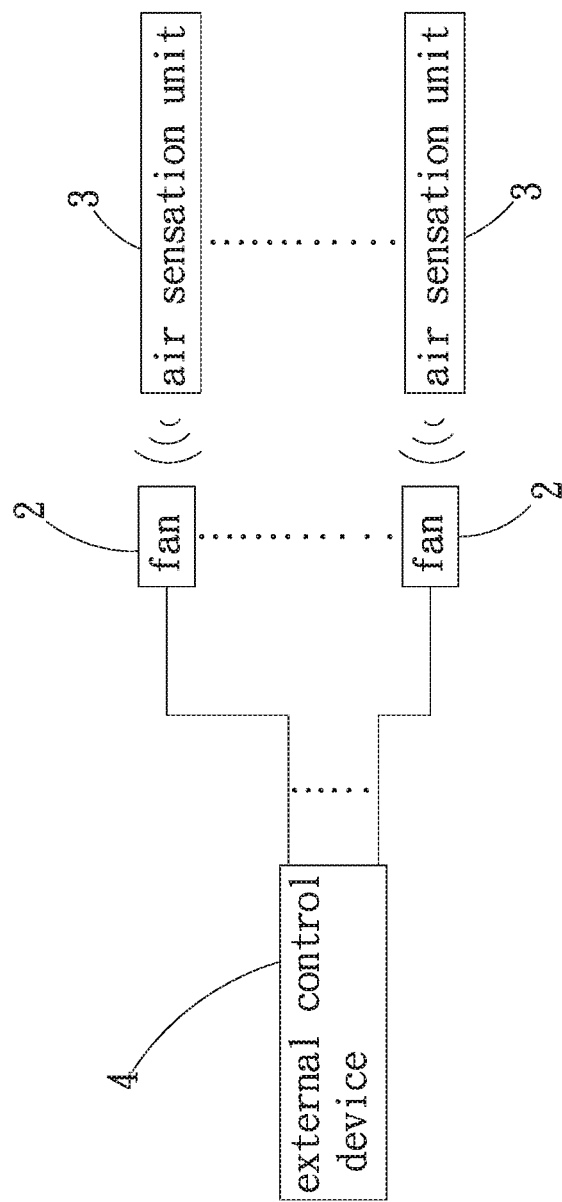
FIG. 4 is a block diagram of the first and second embodiments of the heat dissipation system of the present invention.
Figure 5A:
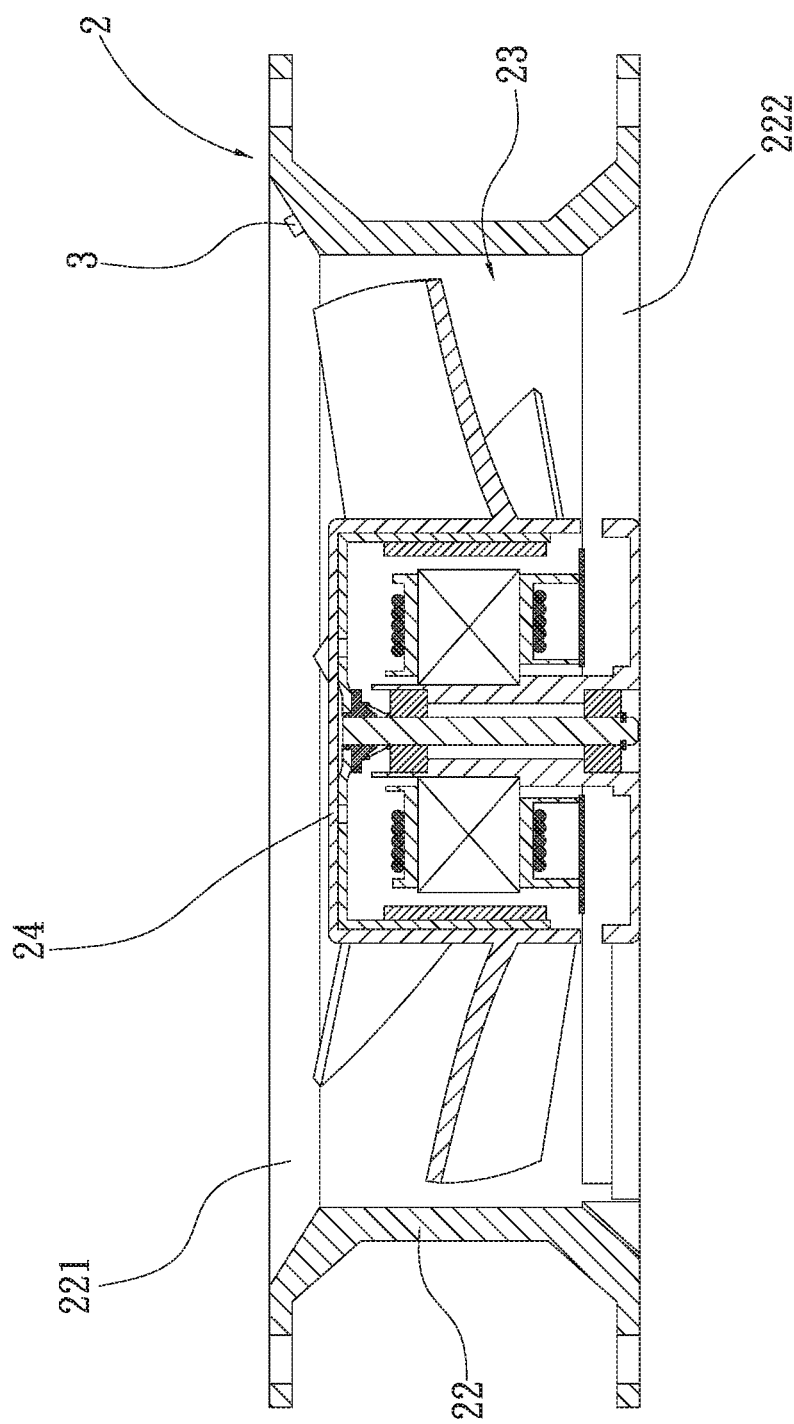
FIG. 5A is a sectional assembled view of the heat dissipation system of the present invention, showing the fan and the air sensation unit of the present invention in a first aspect.
Figure 5B:
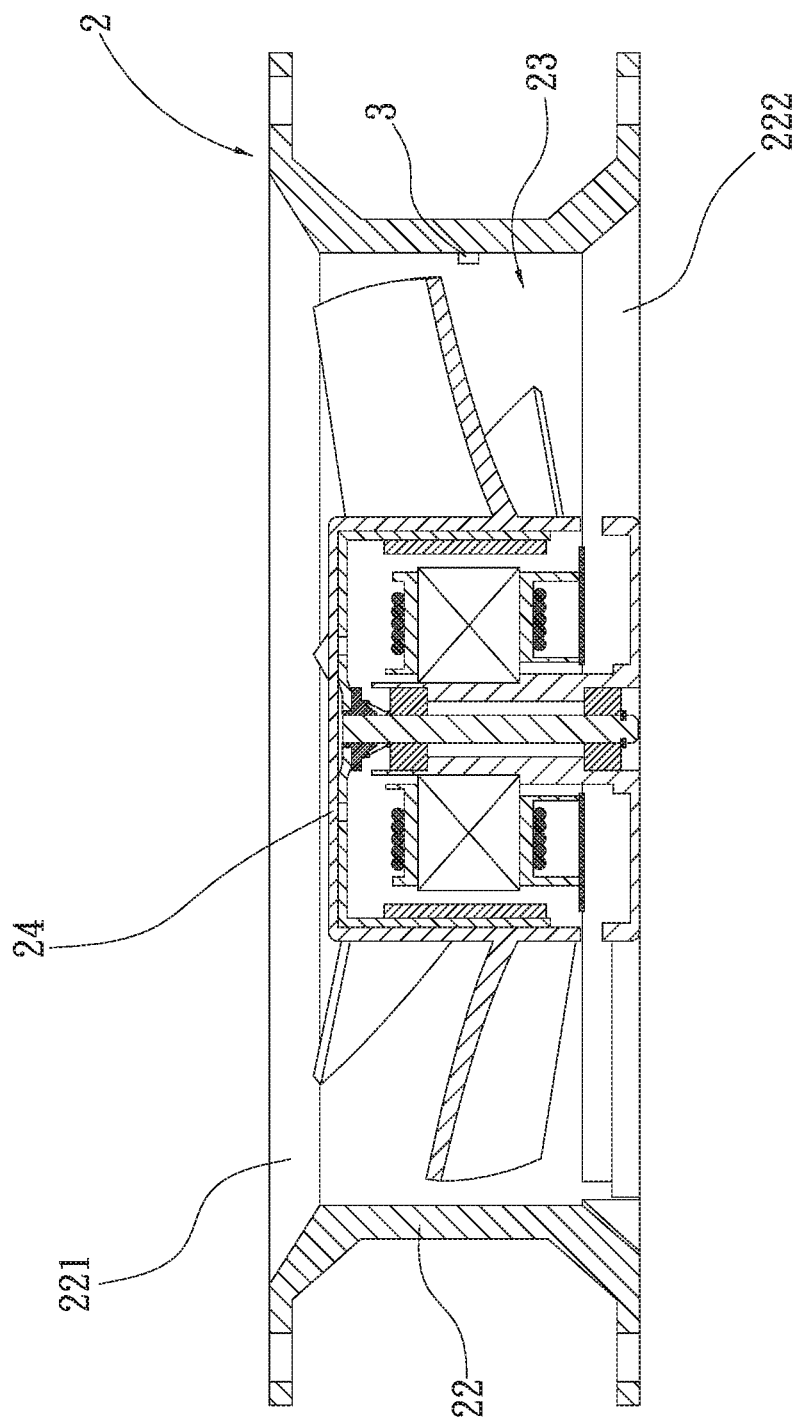
FIG. 5B is a sectional assembled view of the heat dissipation system of the present invention, showing the fan and the air sensation unit of the present invention in a second aspect.
Figure 5C:
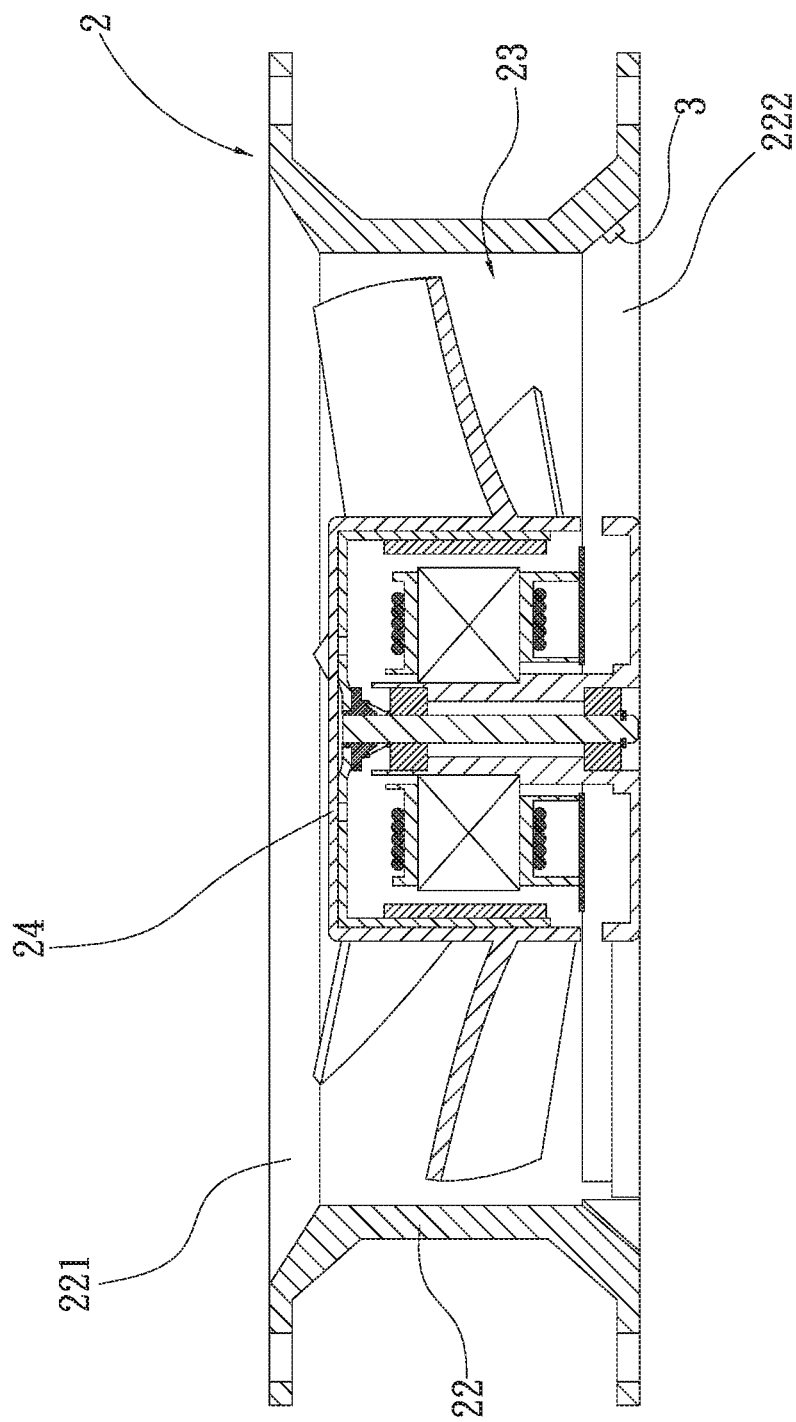
FIG. 5C is a sectional assembled view of the heat dissipation system of the present invention, showing the fan and the air sensation unit of the present invention in a third aspect.

Please refer to FIGS. 1, 2 and 4 and supplementally to FIG. 5C. FIG. 1 is a perspective assembled view of the heat dissipation system of the present invention. FIG. 2 is a perspective exploded view of the heat dissipation system of the present invention. FIG. 4 is a block diagram of the first and second embodiments of the heat dissipation system of the present invention. FIG. 5C is a sectional assembled view of the heat dissipation system of the present invention, showing the fan and the air sensation unit of the present invention in a third aspect. The heat dissipation system with air sensation function of the present invention includes a chassis 1, multiple fans 2, multiple air sensation units 3 and an external control device 4. In this embodiment, the chassis 1 is, but not limited to, a server chassis. In practice, the chassis 1 can be alternatively a telecommunication chassis or any other chassis for containing therein multiple electronic devices, (such as a monitoring system chassis, a broadcasting system chassis or a communication chassis). The chassis 1 has at least one installation face 11 and a receiving space 13. Multiple electronic devices such as servers (not shown) are disposed in the receiving space 13. The installation face 11 has multiple installation holes 111 passing through the installation face 11. The installation holes 111 are arranged on the installation face 11 in different positions. As shown in FIG. 2, three longitudinal rows of installation holes 111 and three transverse installation holes 111 are arranged on the installation face 11 in matrix form. The fans 2 are correspondingly disposed in the installation holes 111 in communication with the receiving space 13. In this embodiment, there are nine fans 2. The fans 2 serve to exhaust the hot air generated by the multiple electronic devices in the chassis 1 out of the chassis 1. In a modified embodiment, the fans 2 can be used to guide the external air into the chassis 1 to forcedly dissipate the heat generated by the electronic devices.

Each fan 2 has a frame body 22 and an impeller 24. The frame body 22 has an air inlet side 221, an air outlet side 222 and a flow way 23. The flow way 23 is positioned between the air inlet side 221 and the air outlet side 222. The air inlet side 221 communicates with the air outlet side 222, the flow way 23 and the receiving space 13. The impeller 24 is received in the flow way 23 of the frame body 22. The air sensation units 3 are correspondingly disposed on the fans 2. In this embodiment, the air sensation units 3 are pressure sensors (or so-called wind pressure sensors) and each fan 2 has one air sensation unit 3 disposed on the fan 2. The air sensation unit 3 (the pressure sensor) is positioned on the inner side of the frame body 22 at the air outlet side 222 of the fan 2 (as shown in FIG. 5C). The air sensation units 3 serve to detect the air state of the corresponding fans 2, (such as the wind pressure of the air blown from the air outlet sides of the fans) to generate an air sensation signal containing therein wind pressure data.

In addition, in practice, each fan 2 can have more than one air sensation unit 3 disposed therein. Alternatively, there can be multiple air sensation units 3 (such as two or more than three air sensation units 3) disposed in each fan 2. For example, two air sensation units 3 are respectively positioned on the inner side of the frame body 22 at the air outlet side 222 and the air inlet side 221 of each fan 2. Alternatively, three air sensation units 3 are respectively positioned on the inner side of the frame body 22 at the flow way 23, the air outlet side 222 and the air inlet side 221 of each fan 2. By means of the multiple air sensation units 3, the sensation precision can be enhanced. In a modified embodiment as shown in FIG. 5A, the air sensation unit 3 is positioned on the inner side of the frame body 22 at the air inlet side 221 of each fan 2. In another modified embodiment as shown in FIG. 5B, the air sensation unit 3 is positioned on the inner side of the frame body 22 in the flow way 23 of each fan 2.

The external control device 4 is electrically connected to the fans 2 and the air sensation units 3. In this embodiment, the external control device 4 is a notebook received in the receiving space 13 of the chassis 1 corresponding to the fans 2. In a modified embodiment, the external control device 4 is selectively an intelligent mobile device or a computer. The external control device 4 serves to receive the air sensation signal transmitted from the air sensation unit 3 of the fan 2 and compare the data (such as the wind pressure data) contained in the air sensation signal with preset data (such as preset wind pressure data) to find whether the wind pressure data contained in the air sensation signal of each fan 2 are identical to the preset data. In case the data contained in the air sensation signal of each fan 2 are identical to the preset data, the external control device 4 will not control/adjust the rotational speed of the fan 2. At this time, as a whole, a uniform airflow flows out of the air outlet sides 222 of the fans 2 so that the noise is effectively lowered. In case it is found by the external control device 4 that the data (such as the wind pressure data) contained in the air sensation signal of at least one fan 2, (for example, two fans 2), are not identical to the preset data, then, on the basis of the preset data (such as the preset wind pressure data), the external control device 4 will control/adjust the rotational speed of the two fans 2 not identical to the preset data so as to change the wind pressure of air blown from the fans 2 until the data contained in the air sensation signal of all the fans 2 are identical to the preset data. At this time, a uniform airflow flows out of the air outlet sides 222 of the fans 2. Therefore, the whole flow field of the air outlet sides 222 of the fans 2 is unified to avoid generation of eddy and further effectively lower the noise. The preset data include the preset wind pressure data.

In another embodiment, the external control device 4 serves to receive the air sensation signals transmitted from the air sensation units 3 of all the fans 2 and compare the data (such as the wind pressure data) contained in the air sensation signals with each other to find whether the wind pressure data contained in the air sensation signals of the fans 2 are identical to each other. In case the data contained in the air sensation signals of the fans 2 are identical to each other, the external control device 4 will not control/adjust the rotational speed of the fans 2. At this time, as a whole, a uniform airflow flows out of the air outlet sides 222 of the fans 2 so that the noise is effectively lowered. In case it is found by the external control device 4 that the data (such as the wind pressure data) contained in the air sensation signals of at least one fan 2, (for example, two fans 2), are not identical to each other, then, on the basis of the data contained in the air sensation signals of most of the fans 2 with identical data, the external control device 4 will control/adjust the rotational speed of the less fans 2 (such as two fans 2) with not identical data so as to change the wind pressure of air blown from the less fans 2 until the data contained in the air sensation signals of all the fans 2 are identical to each other. At this time, a uniform airflow flows out of the air outlet sides 222 of the fans 2.

Accordingly, by means of the heat dissipation system of the present invention, the shortcoming of the conventional chassis that the wind speed of the airflow flowing out of the air outlets of multiple fans 52 is not uniform can be improved and the noise can be effectively lowered.

Please now refer to FIGS. 1 and 4 and supplementally to FIGS. 5A, 5B and 5C. FIG. 1 is a perspective assembled view of the heat dissipation system of the present invention. FIG. 4 is a block diagram of the first and second embodiments of the heat dissipation system of the present invention. The second embodiment is substantially identical to the first embodiment in structure, connection relationship and effect and thus will not be repeatedly described. The second embodiment is mainly different from the first embodiment in that the air sensation unit 3 of the second embodiment is a wind speed sensor instead of the pressure sensor and the preset data include preset wind speed data instead of the preset wind pressure data. In practice, the preset data can include preset wind speed data and wind pressure data. The air sensation units 3 serve to detect the air state of the corresponding fans 2, (such as the wind speed of the air blown out from the air outlet sides of the fans) to generate the air sensation signals containing therein the wind speed data. The preset data include the preset wind speed data.

The external control device 4 serves to receive the air sensation signal transmitted from the air sensation unit 3 of the fan 2 and compare the data (such as the wind speed data) contained in the air sensation signal with the preset data (such as preset wind speed data) to find whether the wind speed data contained in the air sensation signal of each fan 2 are identical to the preset data. In case the data contained in the air sensation signal of each fan 2 are identical to the preset data, the external control device 4 will not control/adjust the rotational speed of the fan 2. At this time, as a whole, a uniform airflow flows out of the air outlet sides 222 of the fans 2 so that the noise is effectively lowered. In case it is found by the external control device 4 that the data (such as the wind speed data) contained in the air sensation signal of at least one fan 2, (for example, two fans 2), are not identical to the preset data, then, on the basis of the preset data (such as the preset wind speed data), the external control device 4 will control/adjust the rotational speed of the two fans 2 not identical to the preset data so as to change the wind speed of air blown from the fans 2 until the data contained in the air sensation signal of all the fans 2 are identical to the preset data. At this time, a uniform airflow flows out of the air outlet sides 222 of the fans 2. Therefore, the whole flow field of the air outlet sides 222 of the fans 2 is unified to avoid generation of eddy and further effectively lower the noise.

Figure 4A:
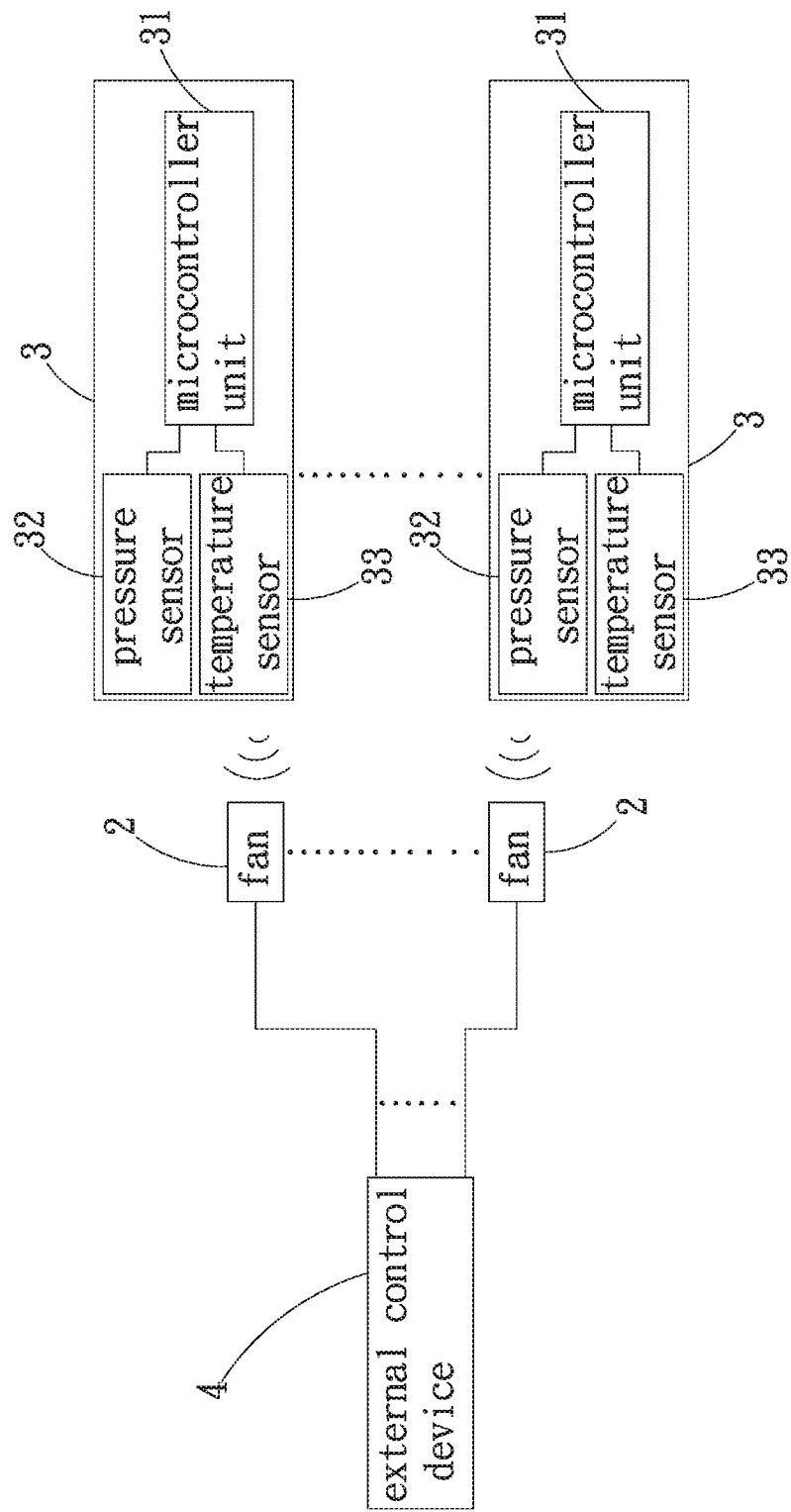
FIG. 4A is a block diagram of a third embodiment of the heat dissipation system of the present invention.

Please now refer to FIG. 4A and supplementally to FIGS. 1, 5A, 5B and 5C. FIG. 4A is a block diagram of a third embodiment of the heat dissipation system of the present invention. The third embodiment is substantially identical to the first embodiment in structure, connection relationship and effect and thus will not be repeatedly described. The third embodiment is different from the first embodiment in that each air sensation unit 3 includes a microcontroller unit (MCU) 31, a pressure sensor 32 and a temperature sensor 33. The pressure sensor 32 serves to detect the wind pressure of the air blown (or flowing) out of the air outlet side of the corresponding fan 2 to generate a wind pressure sensation signal. The temperature sensor 33 serves to detect the ambient temperature of the corresponding fan 2 to generate a temperature sensation signal. According to the temperature value of the temperature sensation signal and correction data, the microcontroller unit 31 performs an operation to obtain an ambient temperature value. Then, an operation is further performed on the basis of the ambient temperature value and the wind pressure value of the wind pressure sensation signal. That is, the microcontroller unit 31 receives the temperature sensation signal and then, according to the temperature value (not compensated temperature value) of the temperature sensation signal and the correction data, the microcontroller unit 31 performs an operation to obtain a compensated ambient temperature value (or so-called real ambient temperature value). Thereafter, on the basis of the compensated ambient temperature value and the wind pressure value of the wind pressure sensation signal, the microcontroller unit 31 further performs an operation to generate the air sensation signal and the transmit the air sensation signal to the external control device 4.

The data contained in the air sensation signal include corrected wind pressure data. The preset data include the preset wind pressure data. The correction data are correction coefficients for correcting the temperature value of the corresponding temperature sensation signal. In addition, before released from the factory, the manufacturer executes a test process to obtain the correction coefficients of every air sensation unit 3. The correction data are inbuilt and stored in a (not shown) memory of each air sensation unit 3, (such as an RAM, an ROM, an EEPROM, a flash memory or any other memory). Accordingly, by means of the air sensation unit 3 with temperature compensation function, the precision of the sensation can be enhanced.

Figure 6:
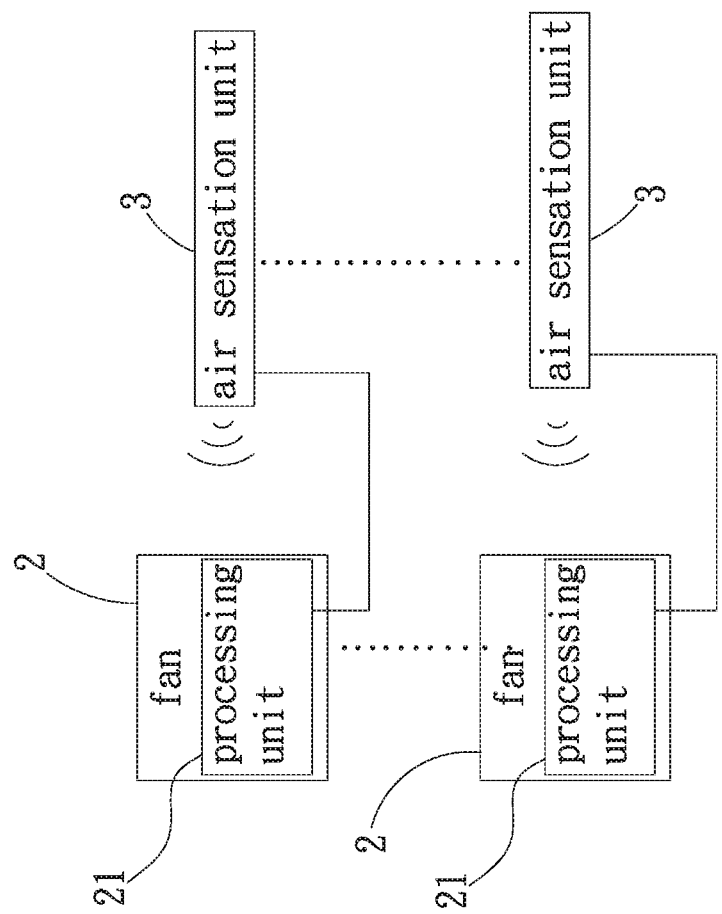
FIG. 6 is a block diagram of a fourth embodiment of the heat dissipation system of the present invention.

Please now refer to FIG. 6 and supplementally to FIGS. 1, 5A, 5B and 5C. FIG. 6 is a block diagram of a fourth embodiment of the heat dissipation system of the present invention. The fourth embodiment is substantially identical to the first embodiment in structure, connection relationship and effect and thus will not be repeatedly described. The fourth embodiment is different from the first embodiment in that the fourth embodiment includes a processing unit 21 in each fan 2 instead of the external control device 4. As shown in FIG. 6, a processing unit 21 and a circuit board (not shown) are disposed in each fan 2. The processing unit 21 can be a central processing unit (CPU) or a microprocessor control unit (MCU) for controlling/driving the fan 2 to operate. The processing unit 21 is disposed on the circuit board. The processing unit 21 of each fan 2 is electrically connected to the corresponding air sensation unit 3. The processing unit 21 of each fan 2 serves to receive the air sensation signal transmitted from the air sensation unit 3 of the same fan 2 and compare the wind pressure data contained in the air sensation signal with preset data (such as preset wind pressure data) to find whether the wind pressure data contained in the air sensation signal are identical to the preset data. In case the data (such as the wind pressure data) contained in the air sensation signal of each fan 2 are identical to the preset data, the processing unit 21 of each fan 2 will not control/adjust the rotational speed of the fan 2 itself. The preset data in every fan 2 are identical to each other. Therefore, as a whole, a uniform airflow flows out of the air outlet sides 222 of the fans 2 so that the noise is effectively lowered. The preset data include preset air volume data, preset wind speed data and preset wind pressure data.

In case it is found by the processing units 21 of two fans 2 themselves that the data (such as the wind pressure data) contained in the air sensation signals of the two fans 2 are not identical to the preset data (such as the preset wind pressure data), then, on the basis of the preset data, the processing units 21 of the two fans 2 themselves will control/adjust the rotational speed of the two fans 2 so as to change the wind pressure of air blown from the fans 2 until the data contained in the air sensation signals of the fans 2 themselves are identical to the preset data. At this time, as a whole, a uniform airflow flows out of the air outlet sides 222 of the fans 2 to avoid generation of eddy and further effectively lower the noise.

In a modified embodiment, the air sensation unit 3 is a wind speed sensor instead of the pressure sensor and the preset data include preset wind speed data instead of the preset wind pressure data. That is, the air sensation unit 3 serves to detect the air state of each corresponding fan 2, (such as the wind speed of the air blown out from the air outlet side 222 of each fan 2) to generate the air sensation signal containing therein the wind speed data. The preset data include the preset wind speed data.

Figure 6A:
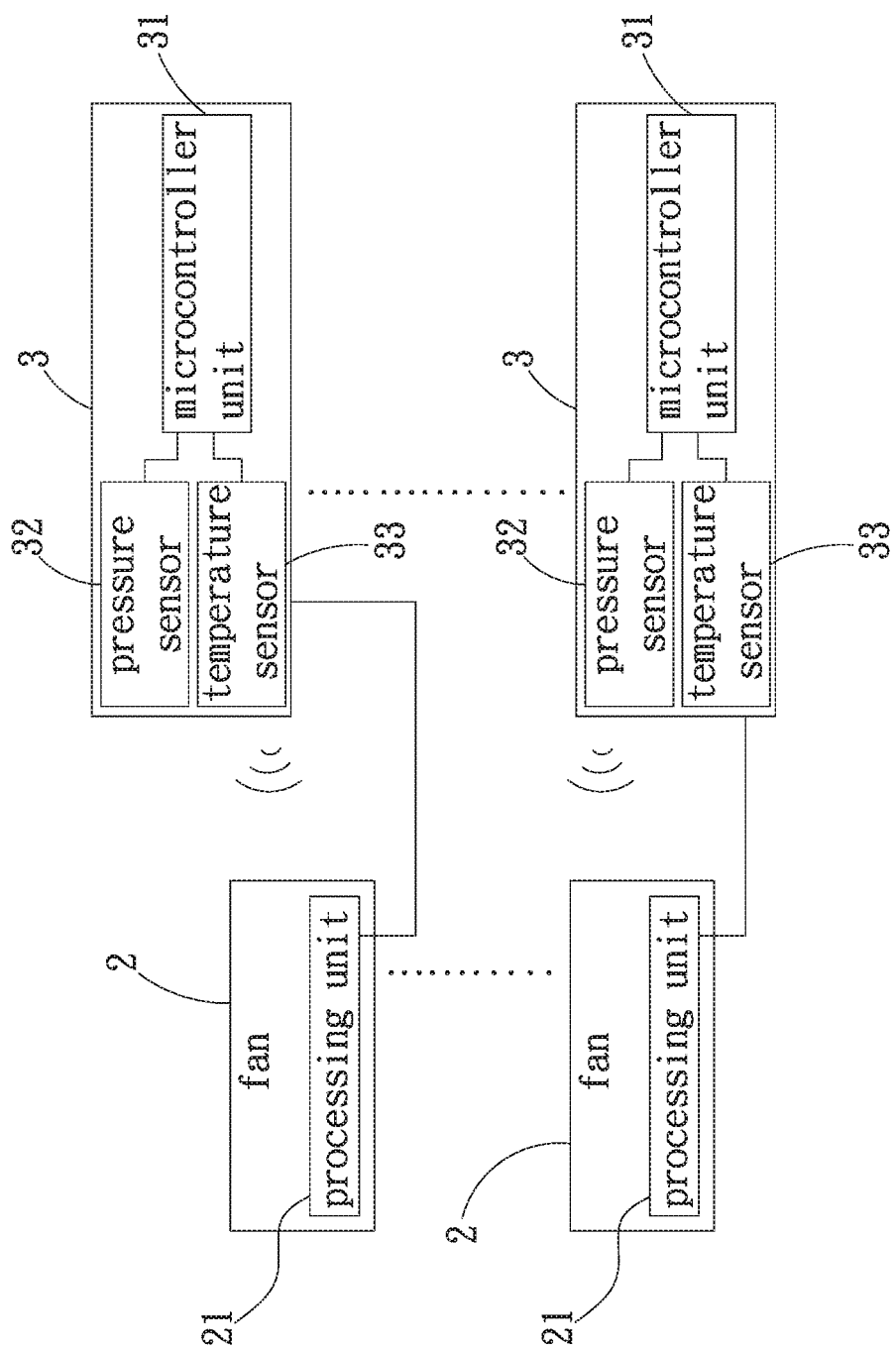
FIG. 6A is another block diagram of the fourth embodiment of the heat dissipation system of the present invention.
Figure 7:
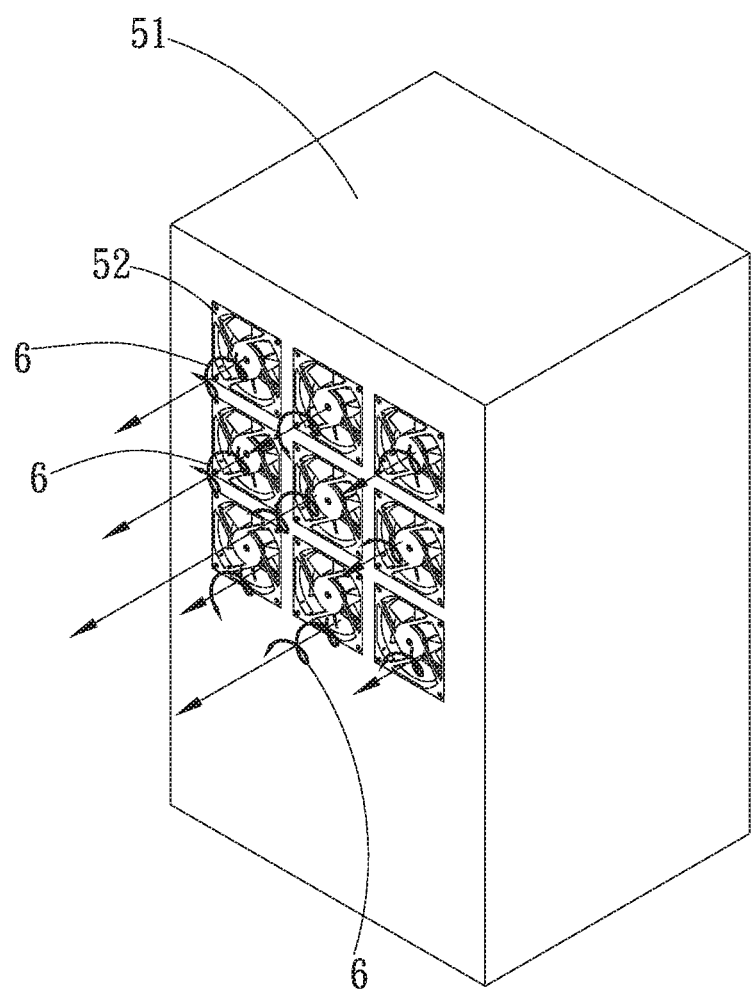
FIG. 7 is a perspective view of a conventional heat dissipation system, showing the operation thereof.

In another embodiment as shown in FIG. 6A, each air sensation unit 3 includes a microcontroller unit (MCU) 31, a pressure sensor 32 and a temperature sensor 33. The pressure sensor 32 serves to detect the wind pressure of the air blown (or flowing) out of the air outlet side of the corresponding fan 2 to generate a wind pressure sensation signal. The temperature sensor 33 serves to detect the ambient temperature of the corresponding fan 2 to generate a temperature sensation signal. According to the temperature value (not compensated temperature value) of the received temperature sensation signal and the correction data, the microcontroller unit 31 performs an operation to obtain a compensated ambient temperature value (or so-called real ambient temperature value). Then, on the basis of the compensated ambient temperature value and the wind pressure value of the wind pressure sensation signal, the microcontroller unit 31 further performs an operation to generate the air sensation signal and the transmit the air sensation signal to the corresponding fan 2. In an alternative embodiment, the microcontroller unit 31 of the air sensation unit 3 is omitted and the processing unit 21 of the fan 2 itself will perform the operation.

The data contained in the air sensation signal include the corrected wind pressure data. The preset data include the preset wind pressure data. The correction data are correction coefficients for correcting the temperature value of the corresponding temperature sensation signal. In addition, before released from the factory, the manufacturer executes a test process to obtain the correction coefficients of every air sensation unit 3. The correction data are inbuilt and stored in a (not shown) memory of each air sensation unit 3, (such as an RAM, an ROM, an EEPROM, a flash memory or any other memory). Accordingly, by means of the air sensation unit 3 with temperature compensation function, the precision of the sensation can be enhanced.

In conclusion, by means of the heat dissipation system of the present invention, the shortcoming of the conventional chassis that the wind speed of the airflow flowing out of the air outlets of multiple fans 52 is not uniform can be improved and the noise can be effectively lowered.

The present invention has been described with the above embodiments thereof and it is understood that many changes and modifications in the above embodiments can be carried out without departing from the scope and the spirit of the invention that is intended to be limited only by the appended claims.

What is claimed is:

1. A heat dissipation system with air sensation function, comprising:
   a chassis having at least one installation face and a receiving space, the installation face being at one side of the chassis and having multiple installation holes passing through the installation face in communication with the receiving space;
   multiple fans correspondingly being installed in the installation holes of the installation face, each of the fans having an air inlet side and an air outlet side, the air inlet side and the air outlet side respectively facing the receiving space of the chassis and outside, said fans further being disposed to exhaust air away from a heat source;
   multiple air sensation units being pressure sensors and respectively correspondingly disposed on the air outlet sides of the fans for detecting the air state of the air outlet sides of the fans to generate an air sensation signal; and
   an external control device electrically connected to the corresponding fans and the air sensation units, the external control device serving to receive the air sensation signal transmitted from the air sensation units and compare the data contained in the air sensation signal with preset data to find whether the data contained in the air sensation signal are identical to the preset data, in case it is found that the data contained in the air sensation signal of the at least one fan are not identical to the preset data, the external control device controls or adjusts the rotational speed of the at least one fan that is different from the preset data until all of the fans having the same rotational speed, such that a uniform airflow flows out of the air outlet sides of the fans.

2. The heat dissipation system with air sensation function as claimed in claim 1, wherein each fan has a frame body and an impeller, the frame body having the air outlet side, the air inlet side and a flow way positioned between the air inlet side and the air outlet side, the air inlet side communicating with the air outlet side, the flow way and the receiving space, the impeller being received in the flow way of the frame body.

3. The heat dissipation system with air sensation function as claimed in claim 1, wherein the external control device is received in the receiving space of the chassis corresponding to the fans, the external control device being a notebook, an intelligent mobile device or a computer.

4. The heat dissipation system with air sensation function as claimed in claim 1, wherein the air sensation unit is used to detect the wind pressure of the air blown out from the corresponding fan to generate the air sensation signal, the data contained in the air sensation signal including wind pressure data, the preset data including preset wind pressure data.

5. The heat dissipation system with air sensation function as claimed in claim 1, wherein in case the external control device compares and finds that the data contained in the air sensation signal of the fan are identical to the preset data, the external control device will not control/adjust the rotational speed of the fan.

* * * * *